(12) United States Patent
Chang et al.

(10) Patent No.: US 9,263,447 B2
(45) Date of Patent: Feb. 16, 2016

(54) SEMICONDUCTOR DEVICE

(71) Applicant: Nuvoton Technology Corporation, Hsinchu (TW)

(72) Inventors: Chia-Wei Chang, New Taipei (TW); Po-An Chen, Toufen Township, Miaoli County (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 14/680,482

(22) Filed: Apr. 7, 2015

(65) Prior Publication Data

US 2015/0364471 A1 Dec. 17, 2015

(30) Foreign Application Priority Data

Jun. 11, 2014 (TW) ............................. 103120135 A (51) Int. Cl.
| | |
|---|---|
| H01L 21/74 | (2006.01) |
| H01L 27/092 | (2006.01) |
| H01L 29/78 | (2006.01) |
| H01L 29/10 | (2006.01) |
| H01L 29/06 | (2006.01) |
| H01L 29/08 | (2006.01) |
| H01L 21/8238 | (2006.01) |
| H01L 21/761 | (2006.01) |

(52) U.S. Cl.
CPC ........ *H01L 27/0922* (2013.01); *H01L 27/0928* (2013.01); *H01L 29/0619* (2013.01); *H01L 29/0642* (2013.01); *H01L 29/0878* (2013.01); *H01L 29/1079* (2013.01); *H01L 29/1095* (2013.01); *H01L 29/7823* (2013.01); *H01L 21/761* (2013.01); *H01L 21/823878* (2013.01); *H01L 21/823892* (2013.01); *H01L 29/0623* (2013.01)

(58) Field of Classification Search
CPC ...................... H01L 21/761; H01L 21/823892; H01L 29/0619; H01L 29/0623; H01L 21/823878

USPC ................................... 257/351, 371, 372, 500
See application file for complete search history.

(56) References Cited

U.S. PATENT DOCUMENTS

| | | | |
|---|---|---|---|
| 4,258,379 A * | 3/1981 | Watanabe | H01L 21/74 257/574 |
| 6,212,671 B1 * | 4/2001 | Kanehira | H01L 21/761 257/E21.544 |
| 6,288,424 B1 | 9/2001 | Ludikhuize | |
| 6,729,886 B2 | 5/2004 | Efland et al. | |
| 6,924,531 B2 | 8/2005 | Chen et al. | |
| 2003/0197242 A1 * | 10/2003 | Chen | H01L 21/823878 257/509 |
| 2005/0179093 A1 * | 8/2005 | Morris | H01L 21/761 257/371 |
| 2007/0235831 A1 * | 10/2007 | Liu | H01L 21/761 257/502 |
| 2008/0237656 A1 * | 10/2008 | Williams | H01L 21/761 257/262 |
| 2014/0368943 A1 * | 12/2014 | Miyagoe | H01L 27/0921 360/46 |

* cited by examiner

*Primary Examiner* — George Fourson, III
(74) *Attorney, Agent, or Firm* — Muncy, Geissler, Olds & Lowe, P.C.

(57) ABSTRACT

A semiconductor device, including: a P-type substrate; an N-type region, contacting with the P-type substrate; a N+-type doped region, disposed in the N-type region; a first P+-type doped region, disposed in the N-type region; a second P+-type doped region, disposed in the N-type region; a P-type buried layer, disposed in the P-type substrate under the N-type region and contacting with the N-type region; and a N-type doped region, disposed in the P-type substrate under a contact surface between the P-type buried layer and the N-type region.

20 Claims, 9 Drawing Sheets

SEMICONDUCTOR DEVICE

CROSS REFERENCE TO RELATED APPLICATIONS

This Application claims priority of Taiwan Patent Application No. 103120135, filed on Jun. 11, 2014, the entirety of which is incorporated by reference herein.

BACKGROUND OF THE INVENTION

1. Field of the Invention

The invention relates to semiconductor devices, and more specifically, to semiconductor devices capable of avoiding latch-up.

2. Description of the Related Art

Latch-up effect is common in Complementary Metal Oxide Semiconductor (CMOS) devices. The main reason of the formation of the latch-up effect is that parasitic Silicon Controlled Rectifier (SCR) component between the N-type Metal Oxide semiconductor (NMOS) and the P-type Metal Oxide Semiconductor (PMOS) has been trigged. Once the parasitic SCR component has been triggered, unintended high-current will be generated, thereby affecting the normal operation of the semiconductor device even further causing the wafer to be put too much current and burned.

Figure 1A:
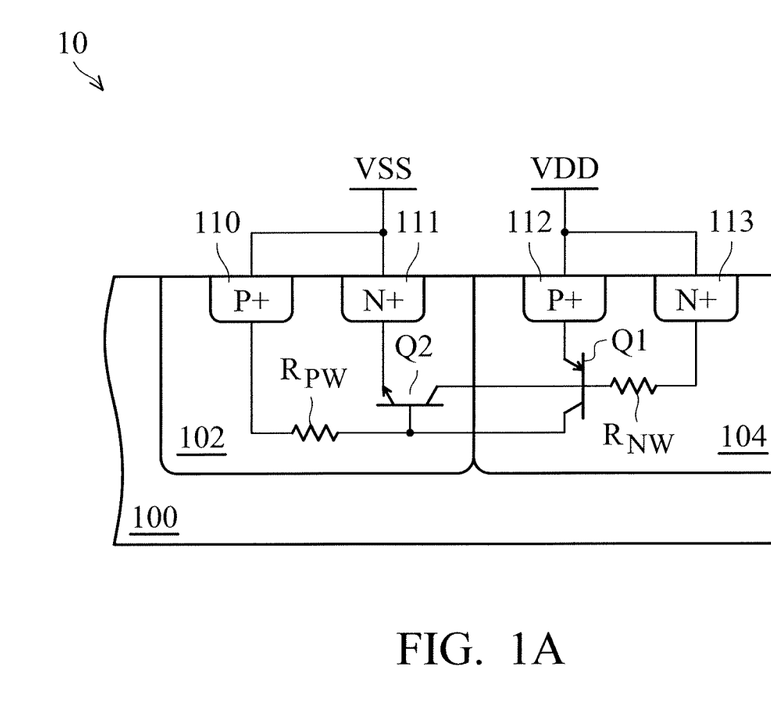
FIG. 1A is a schematic diagram of a conventional CMOS device 10.
Figure 1B:
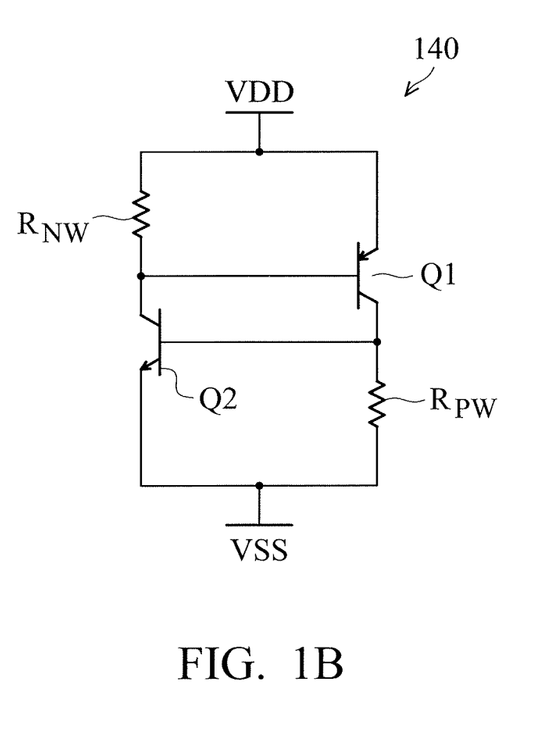
FIG. 1B is a circuit diagram of a parasitic SCR component in the conventional CMOS device.

FIG. 1A is a schematic diagram of a conventional CMOS device 10. The CMOS device 10 comprises a P-type substrate 100, a P-type well region 102 and a N-type well region 104 formed on the P-type substrate 100, a P+-type doped region 110 and a N+-type doped region 111 formed on the P type well region 102, and a P+-type doped region 112 and a N+-type doped region 113 formed on the N-type well region 104. As shown in FIG. 1A, the CMOS device 10 has a pair of parasitic Bipolar Junction Transistors (BJT), namely the parasitic PNP-type BJT Q1 and the parasitic NPN-type BJT Q2. The parasitic BJTs Q1 and Q2, the resistance $R_{NW}$ of the N-type well region 104 and the resistance $R_{PW}$ of the P-type well region resistance 102 form the parasitic SCR component 140 as shown in FIG. 1B. When the parasitic SCR component 140 is triggered, the parasitic NPN-type BJT Q2 is turned on to generate the base current, and the base current will flow through the parasitic PNP-type BJT Q1 such that the collector voltage of Q1 rises to over the turn-on voltage, thereby turning on the parasitic PNP-type BJT Q1. After the parasitic PNP-type BJT Q1 is turned on, the base current is generated, and will then flow through the parasitic NPN-type BJT Q2 and generate more current. Such positive feedback phenomenon may cause the current to be increased repeatedly, leading to damage of the semiconductor device.

Figure 2A:
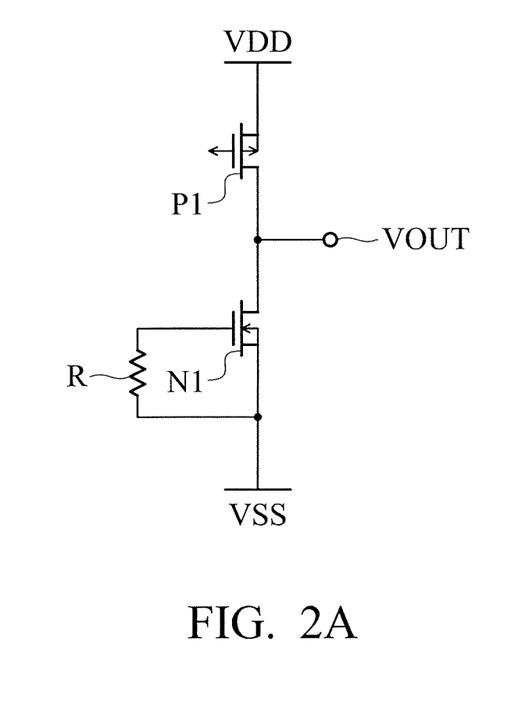
FIG. 2A is a circuit diagram of a conventional power circuit.
Figure 2B:
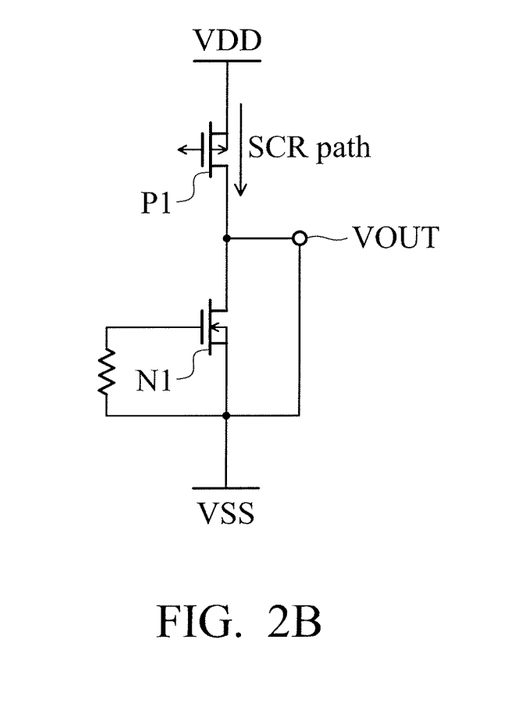
FIG. 2B is a circuit diagram of a conventional power circuit under the short circuit test.
Figure 2C:
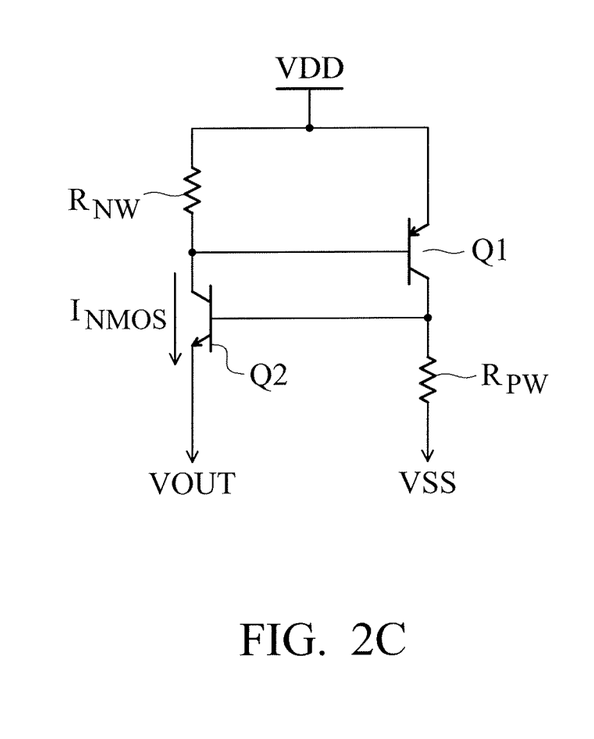
FIG. 2C is a circuit diagram of a parasitic SCR component in the conventional CMOS device under the short circuit test.

Taking a power circuit as an example in the following for illustrating how the parasitic SCR component in the CMOS device is triggered. FIG. 2A is a circuit diagram of a conventional power circuit. The power circuit includes the power PMOS transistor P1, the Electrostatic Discharge (ESD) NMOS transistors N1, the resistor R and the output terminal VOUT. FIG. 2B is a circuit diagram of a conventional power circuit under the short circuit test (SCT). As shown in FIG. 2B, in the short circuit test, the output terminal VOUT is connected to the ground, resulting in a negative bias. While this negative bias falls into the emitter of the parasitic NPN-type BJT Q2, as shown in FIG. 2C, the parasitic NPN-type BJT Q2 is turned on and a current INMOS is generated, and the parasitic PNP-type BJT Q1 is then turned on accordingly, thus the latch-up current is generated and causes damage to the power circuit components.

Thus, there is a need for the development of the semiconductor device to avoid occurrence of the latch-up.

BRIEF SUMMARY OF THE INVENTION

An embodiment of the invention provides a semiconductor device, comprising: a P-type substrate; an N-type region, contacting the P-type substrate; a N+ doped region, disposed in the N-type region; a first P+ doped region, disposed in the N-type region; a second P+ doped region, disposed in the N-type region; a P-type buried layer, disposed in the P-type substrate under the N-type region and contacting the N-type region; and a N-type doped region, disposed in the P-type substrate under a contact surface between the P-type buried layer and the N-type region.

Another embodiment of the invention provides a semiconductor device, comprising: a P-type substrate; an N-type metal oxide semiconductor (MOS) device; and a P-type MOS device. The P-type MOS device comprises a first N-type region contacting the P-type substrate; a first N+-type doped region disposed in the first N-type region; a first P+-type doped region disposed in the first N-type region; a second P+-type doped region disposed in the first N-type region; a first gate structure, disposed in the N-type doped region between the first P+-type doped region of and the second P+-type doped region; a P-type buried layer disposed in the P-type substrate under the first N-type region and contacting the first N-type region; and a N-type doped region, disposed in the P-type substrate under a contact surface between the P-type buried layer and the first N-type region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It should be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 3:
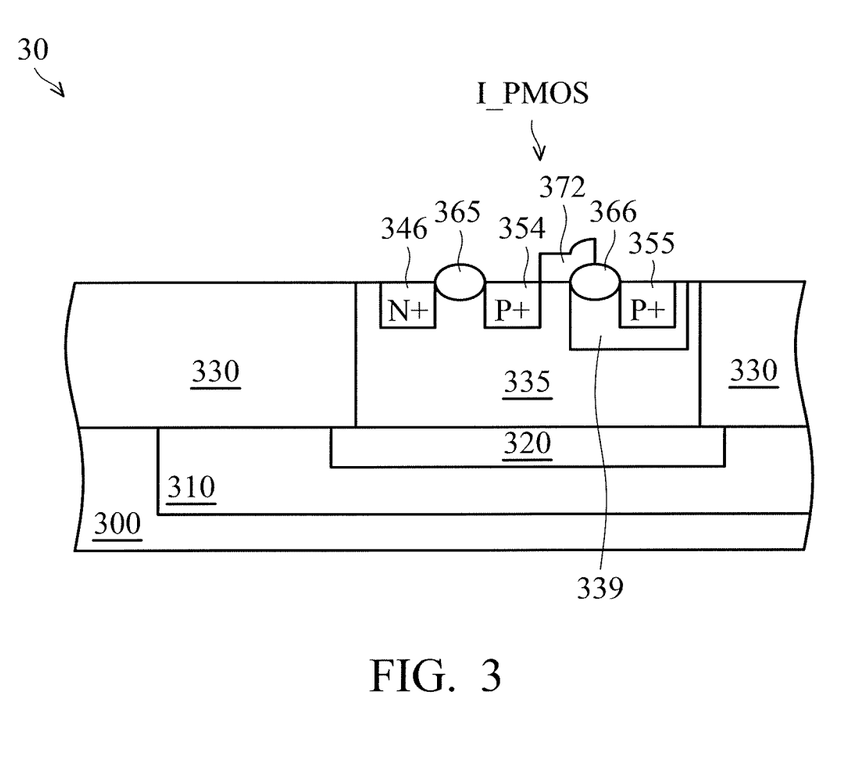
FIG. 3 is a schematic diagram illustrating an embodiment of a semiconductor device of the invention.

FIG. 3 is a schematic diagram illustrating an embodiment of a semiconductor device 30 of the invention. The semiconductor device 30 includes a P-type substrate 300 and isolated P-type metal-oxide semiconductor (PMOS) device I_PMOS. The Isolated P-type MOS device I_PMOS includes a N-type doped region 310, a P-type buried layer 320, an epitaxial layer 330, a high voltage N-type well region 335, a P-type heavily doped drain region (PHDD) 339, a N+-type doped region 346, P+-type doped regions 354 and 355, the isolation structures 365 and 366, and a gate structure 372. In the process, the N-type doped region 310 is first formed on the P-type substrate 300, the P-type buried layer 320 is formed on the N-type doped region 310, followed by the epitaxial layer 330 which is formed on the P-type buried layer 320. The epitaxial layer 330 can be an N-type or P-type epitaxial layer. Next, a high voltage N-type well region 335 and other features are formed in the epitaxial layer 330. The high voltage N-type well region 335 is disposed in the epitaxial layer 330, the N+-type doped region 346, the P+-type doped region 354 and the P-type heavily doped drain region 339 are disposed in the high voltage N-type well region 335, and the P+-type doped region 355 is disposed in the P-type heavily doped drain region 339, in which the P+-type doped region 354 is the source area of the isolated PMOS device I_PMOS, the P+-type doped region 355 is the drain area of the isolated PMOS device I_PMOS and the N+-type doped region 346 is the base area of the isolated PMOS device I_PMOS. The isolation structure 365 is disposed in the surface of the high voltage N-type well region 335 between the N+-type doped region 346 and the P+-type doped region 355, and the isolation structure 366 is disposed in the surface of the P-type heavily doped drain region 339 and is adjacent to the surface of the P+-type doped region 355. The gate structure 372 is disposed between the P+-type doped region 354 and P+-type doped region 355 and it covers part of the high voltage N-type well region 335 and part of the isolation structure 366. The P-type buried layer 320 is disposed in the N-type doped region 310 under the high voltage N-type well region 335 and contacts the high voltage N-type well region 335, wherein the area of the side, which contacts the N-type doped region 310, of the P-type buried layer 320 is larger than that of the side, which contacts the high voltage N-type well region 335, of the P-type buried layer 320, as shown in FIG. 3. In one embodiment, the N-type doped region 310 is an N-type buried layer, and in another embodiment, the N-type doped region 310 is a deep N-type well region. The isolated PMOS device I_PMOS has the P-type buried layer 320 and the N-type doped region 310 such that the lower surface of the high-voltage N-type well region 335 is not in direct contact with the P-type substrate 300, and thus it is called isolated PMOS device in this specification.

The isolated PMOS device I_PMOS of FIG. 3 is an isolated high-voltage PMOS (HVPMOS) device, and another embodiment of the invention may further provide an isolated low-voltage PMOS (LVPMOS) device, wherein the difference between the isolated LVPMOS device and the isolated HVPMOS is that the isolated LVPMOS device has no isolation structure 366 and the P-type heavily doped drain region 339, and the gate structure 372 is disposed between the P+-type doped region 354 and the P+-type doped region 355 and covers only part of the high voltage N-type well region 335 to turn on a channel.

Figure 4:
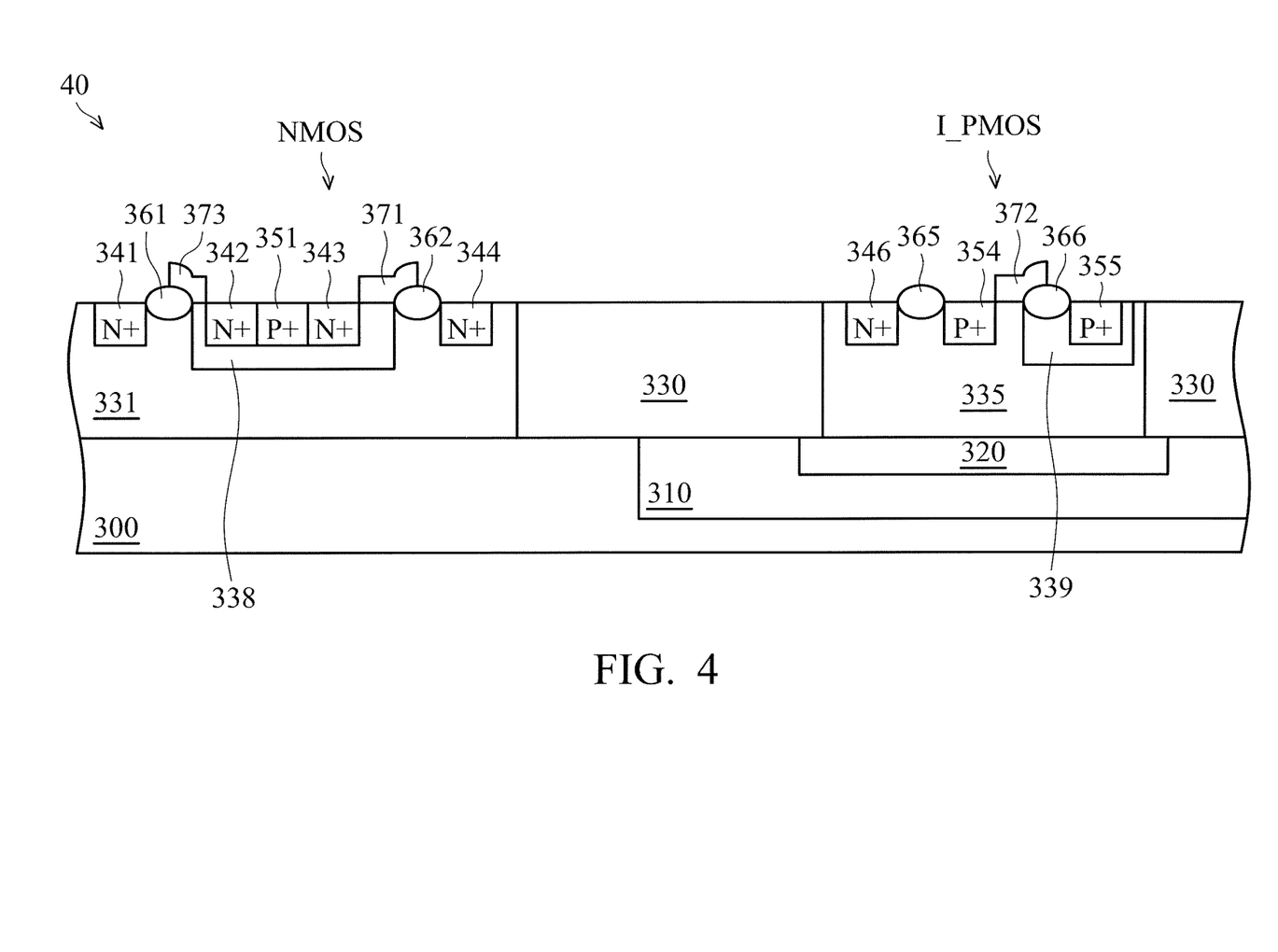
FIG. 4 is a schematic diagram illustrating an embodiment of a semiconductor device of the invention.

FIG. 4 is a schematic diagram illustrating an embodiment of a semiconductor device 40 of the invention. The semiconductor device 40 is a complementary metal oxide semiconductor (CMOS) device, including the P-type substrate 300, the N-type metal oxide semiconductor (NMOS) device NMOS and the isolated PMOS device IPMOS. In one embodiment, the NMOS device NMOS can be a NMOS device of typical CMOS device, and in another embodiment, the NMOS device NMOS is a Laterally Diffused N-type Metal Oxide Semiconductor (LDNMOS) device. In an embodiment of which the NMOS device NMOS is a LDNMOS device, the NMOS device NMOS comprises a high voltage N-type well region 331, a P-type bulk region 338, a P+-type doped region 351, N+-type doped regions 341, 342, 343 and 344, isolation structures 361 and 362 and gate structures 371 and 373. The high voltage N-type well region 331 is disposed in the epitaxial layer 330, and the P-type bulk region 338 is disposed in the high voltage N-type well region 331. The P+-type doped region 351 is disposed in the P-type bulk region 338, the N+-type doped region 342 is disposed in the P-type bulk region 338 and is adjacent to one side of the P+-type doped region 351, the N+-type doped region 343 is disposed in the P-type bulk region 338 and is adjacent to the lateral side of the side, which is adjacent to the N+-type doped region 342, of the P+-type doped region 351. The N+-type doped regions 341 and 344 are both disposed in the high voltage N-type well region 331 and are respectively disposed at both sides of the P-type bulk region 338. Note that, the P+-type doped region 351 is the base area of the NMOS device NMOS, the N+-type doped regions 342 and 343 are the source area of the NMOS device NMOS, while the N+-type doped regions 341 and 344 are the drain area of the NMOS device NMOS. The isolation structure 361 is disposed in the surface of the high voltage N-type well region 331 between the P-type bulk region 338 and the N+-type doped region 341, and the isolation structure 362 is disposed in the surface of the high voltage N-type well region 331 between the P-type bulk region 338 and the N+-type doped region 344. The gate structure 371 is disposed between the N+-type doped region 343 and the N+-type doped region 344 and it covers part of the P-type bulk region 338 and part of the isolation structure 362. The gate structure 373 is disposed between the N+-type doped region 341 and the N+-type doped region 342 and it covers part of the P-type bulk region 338 and part of the isolation structure 361. The isolated PMOS device I_PMOS is the same as that shown in FIG. 3 and thus detailed are omitted here for brevity.

Figure 5:
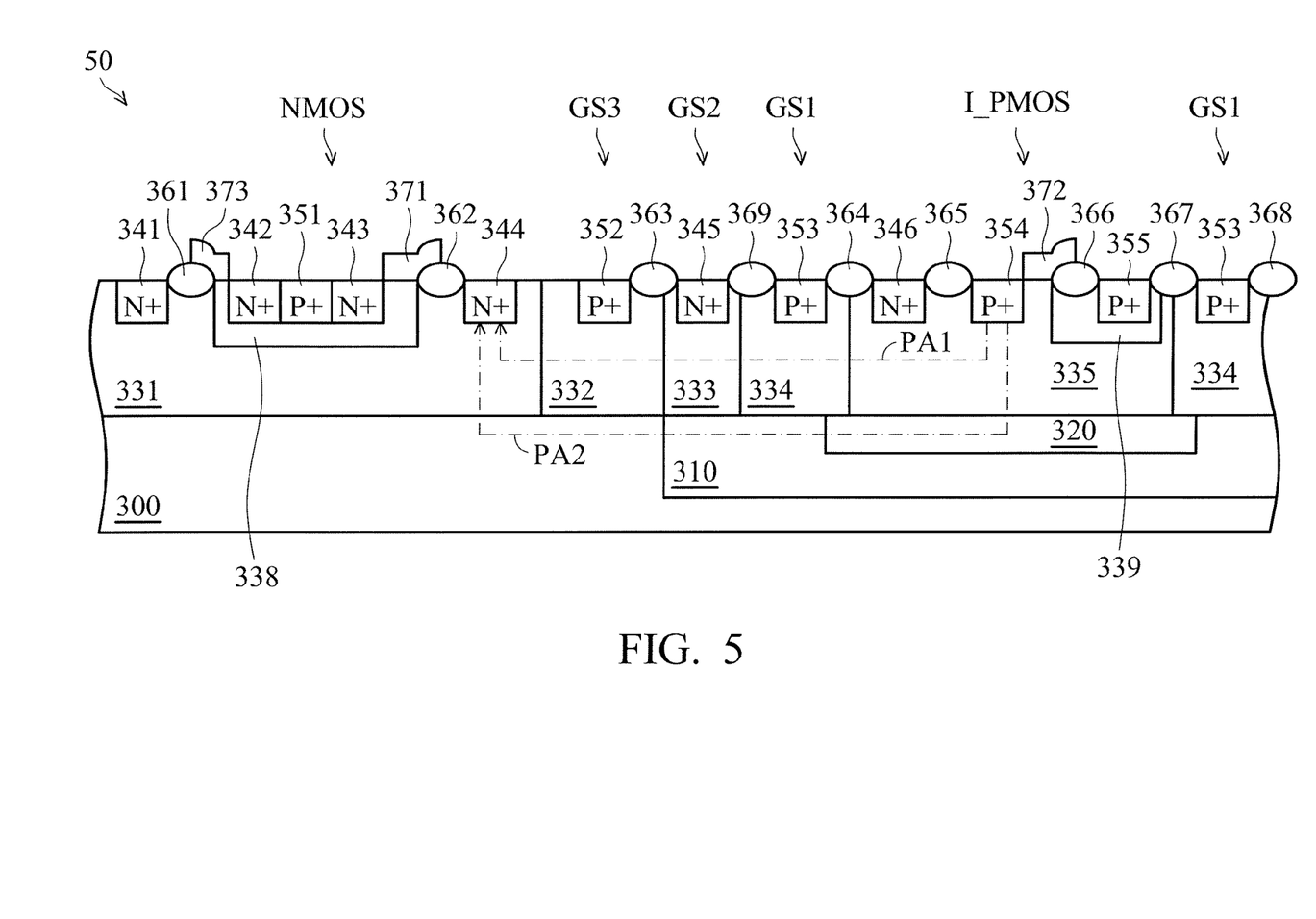
FIG. 5 is a schematic diagram illustrating an embodiment of a semiconductor device of the invention.

FIG. 5 is a schematic diagram illustrating an embodiment of a semiconductor device 50 of the invention. The semiconductor device 50 includes a substrate 300, a NMOS device NMOS, an isolated PMOS device I_PMOS and guard ring devices GS1, GS2 and GS3. The NMOS device NMOS can be a NMOS device of typical CMOS device or a LDNMOS device. In an embodiment of which the NMOS device NMOS is a LDNMOS device, the NMOS device NMOS comprises a high voltage N-type well region 331, a P-type bulk region 338, a P+-type doped region 351, N+-type doped regions 341, 342, 343 and 344, isolation structures 361 and 362 and gate structures 371 and 373. The high voltage N-type well region 331 may be formed on the epitaxial layer 330 (not shown), wherein the epitaxial layer 330 can be an N-type or a P-type epitaxial layer, and the P-type bulk region 338 is disposed in the high voltage N-type well region 331. The P+-type doped region 351 is disposed in the P-type bulk region 338, the N+-type doped region 342 is disposed in the P-type bulk region 338 and is adjacent to one side of the P+-type doped region 351, the N+-type doped region 343 is disposed in the P-type bulk region 338 and is adjacent to the lateral side of the side, which is adjacent to the N+-type doped region 342, of the P+-type doped region 351. The N+-type doped regions 341 and 344 are both disposed in the high voltage N-type well region 331 and are respectively disposed at both sides of the P-type bulk region 338. Note that, the P+-type doped region 351 is the base area of the NMOS device NMOS, the N+-type doped regions 342 and 343 are the source area of the NMOS device NMOS, while the N+-type doped regions 341 and 344 are the drain area of the NMOS device NMOS. The isolation structure 361 is disposed in the surface of the high voltage N-type well region 331 between the P-type bulk region 338 and the N+-type doped region 341, and the isolation structure 362 is disposed in the surface of the high voltage N-type well region 331 between the P-type bulk region 338 and the N+-type doped region 344. The gate structure 371 is disposed between the N+-type doped region 343 and the N+-type doped region 344 and it covers part of the P-type bulk region 338 and part of the isolation structure 362. The gate structure 373 is disposed between the N+-type doped region 341 and the N+-type doped region 342 and it covers part of the P-type bulk region 338 and part of the isolation structure 361.

The Isolated PMOS device I_PMOS includes a N-type doped region 310, a P-type buried layer 320, a high voltage N-type well region 335, a P-type heavily doped drain region (PHDD) 339, a N+-type doped region 346, P+-type doped regions 354 and 355, the isolation structures 365 and 366 and the gate structure 372. The high voltage N-type well region 335 is formed on the epitaxial layer 330 (not shown), the N+-type doped region 346, the P+-type doped region 354 and the P-type heavily doped drain region 339 are disposed in the high voltage N-type well region 335, and the P+-type doped region 355 is disposed in the P-type heavily doped drain region 339, in which the P+-type doped region 354 is the source area of the isolated PMOS device I_PMOS, the P+-type doped region 355 is the drain area of the isolated PMOS device I_PMOS and the N+-type doped region 346 is the base area of the isolated PMOS device I_PMOS. The isolation structure 365 is disposed in the surface of the high voltage N-type well region 335 between the N+-type doped region 346 and the P+-type doped region 354, and the isolation structure 366 is disposed in the surface of the high voltage N-type well region 339 between the P+-type doped region 346 and the P+-type doped region 355. The gate structure 372 is disposed between the P+-type doped region 354 and P+-type doped region 355 and it covers part of the high voltage N-type well region 335 and part of the isolation structure 366. The P-type buried layer 320 is disposed in the N-type doped region 310 under the high voltage N-type well region 335 and contacts the high voltage P-type well 334 and the high voltage N-type well region 335, wherein the area of the side, which contacts the N-type doped region 310, of the P-type buried layer 320 is larger than that of the side, which contacts the high voltage N-type well region 335, of the P-type buried layer 320. In one embodiment, the N-type doped region 310 is an N-type buried layer, and in another embodiment, the N-type doped region 310 is a deep N-type well region.

In the process, the N-type doped region 310 is first formed on the P-type substrate 300, the P-type buried layer 320 is formed on the N-type doped region 310, followed by the epitaxial layer 330 is formed on the P-type buried layer 320, where the epitaxial layer 330 can be an N-type or P-type epitaxial layer, and then forming the high voltage N-type well regions 331, 333 and 335 and the high voltage P-type well regions 332 and 334.

As shown in FIG. 5, the guard ring device GS1 is disposed in the epitaxial layer 330 (not shown) and around the high voltage N-type well region 335, wherein the guard ring device GS1 includes a high voltage P-type well region 334 that is disposed in the epitaxial layer 330 (not shown) and around the high voltage N-type well region 335 and a P+-type doped region 353 that is disposed in the high voltage P-type well region 334, wherein the high voltage P-type well region 334 contacts the P-type buried layer 320, for example, as shown in FIG. 5, the inner ring parts of the high voltage P-type well region 334 are both in contact with the P-type buried layer 320. The guard ring device GS2 is disposed in the epitaxial layer 330 and around the guard ring device GS1, wherein the guard ring device GS2 includes a high voltage P-type well region 333 that is disposed in the epitaxial layer 330 and around the high voltage P-type well region 334 and a N+-type doped region 345 that is disposed in the high voltage N-type well region 333, wherein the high voltage N-type well region 333 contacts the N-type doped region 310, for example, as shown in FIG. 5, the lower surfaces of the high voltage N-type well region 333 are both in contact with the N-type doped region 310. The guard ring device GS3 is disposed in the epitaxial layer 330 and around the NMOS device NMOS, wherein the guard ring device GS3 includes a high voltage P-type well region 332 that is disposed in the epitaxial layer 330 and around the high voltage N-type well region 331 and a P+-type doped region 352 that is disposed in the high voltage P-type well region 332. The isolation device 363 is disposed in the surfaces of the high voltage P-type well region 332 and the high voltage N-type well region 333 between the P+-type doped region 352 and the N+-type doped region 345 and covers part of the high-voltage P-type well region 332 and part of the high voltage N-type well region 333. The isolation device 369 is disposed in the surfaces of the high voltage N-type well region 333 and the high voltage P-type well region 334 between the N+-type doped region 345 and the P+-type doped region 353 and covers part of the high-voltage N-type well region 333 and part of the high voltage P-type well region 334. The isolation device 364 is disposed in the surfaces of the high voltage P-type well region 334 and the high voltage N-type well region 335 between the P+-type doped region 353 and the N+-type doped region 346 and covers part of the high-voltage P-type well region 334 and part of the high voltage N-type well region 335. The isolation device 367 is disposed in the surfaces of the high voltage N-type well region 335 and the high voltage P-type well region 334 between the P+-type doped region 355 and the P+-type doped region 353 and covers part of the high-voltage N-type well region 335 and part of the high voltage P-type well region 334.

As described above, the isolated PMOS device I_PMOS of FIG. 5 is an isolated HVPMOS device, but the invention is not limited thereto. For example, another embodiment of the invention may further provide an isolated LVPMOS device, wherein the difference between the isolated LVPMOS device and the isolated HVPMOS is that the isolated LVPMOS device has no isolation structure 366 and the P-type heavily doped drain region 339, and the gate structure 372 is disposed between the P+-type doped region 354 and the P+-type doped region 355 and covers only part of the high voltage N-type well region 335 to turn on a channel.

Figure 6:
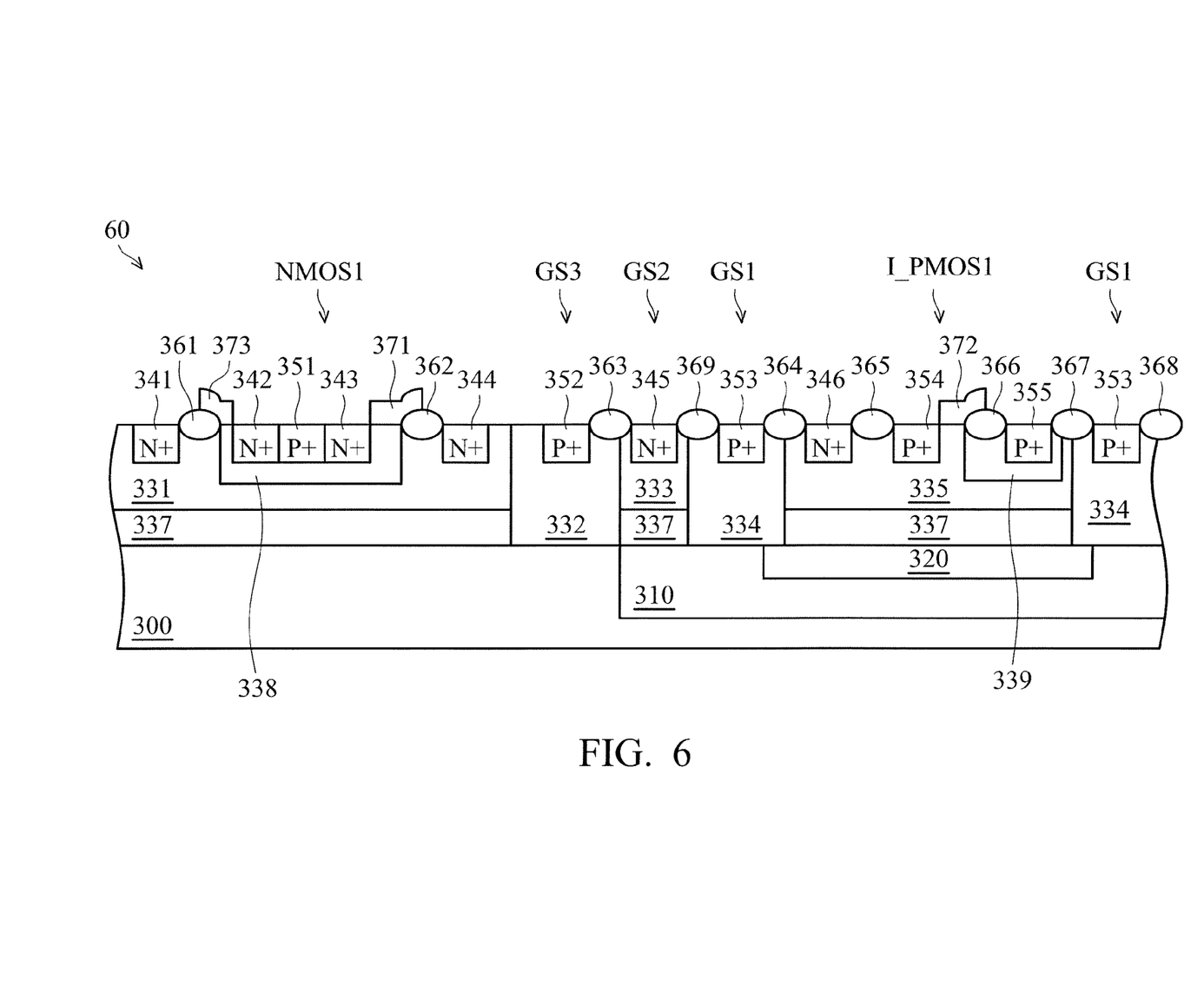
FIG. 6 is a schematic diagram illustrating an embodiment of a semiconductor device of the invention.

FIG. 6 is a schematic diagram illustrating an embodiment of a semiconductor device 60 of the invention. The semiconductor device 60 includes a substrate 300, a NMOS device NMOS1, an isolated PMOS device I_PMOS1 and guard ring devices GS1, GS2 and GS3. The difference between the semiconductor device 60 of FIG. 6 and the semiconductor device 50 of FIG. 5 is that the lower surface of the high voltage N-type well region 331 does not contact the substrate 300 when it is being formed on the N-type epitaxial layer 337, the lower surface of the high voltage N-type well region 333 does not contact the N-type doped region 310 when it is being formed on the N-type epitaxial layer 337 and the lower surface of the high voltage N-type well region 335 does not contact the P-type buried layer 320 when it is being formed on the N-type epitaxial layer 337. In the process, the N-type doped region 310 is first formed on the P-type substrate 300, the P-type buried layer 320 is formed on the N-type doped region 310, followed by the N-type epitaxial layer 337 is formed on the P-type buried layer 320, and then the high voltage N-type well regions 331, 333 and 335 as well as the high voltage P-type well regions 332 and 334 are then formed in the N-type epitaxial layer 337, wherein the depths of the high voltage N-type well regions 331, 333 and 335 are less than the thickness of the N-type epitaxial layer 337, while the depths of the high-voltage P-type well regions 332 and 334 are equal to the thickness of the N-type epitaxial layer 337, thereby making the high voltage P-type well region 332 contacting the substrate 300 and the high voltage P-type well region 334 contacting the N-type doped region 310 and the P-type buried layer 320. As the high voltage N-type well regions 331, 333 and 335 are formed on the N-type epitaxial layer 337 by a same process, the thicknesses of the N-type epitaxial layer 337 under the high voltage N-type well regions 331, 333 and 335 are the same. The remaining parts of the semiconductor device 60 are similar to those of the semiconductor device 50, and thus detailed is omitted here.

Figure 7:
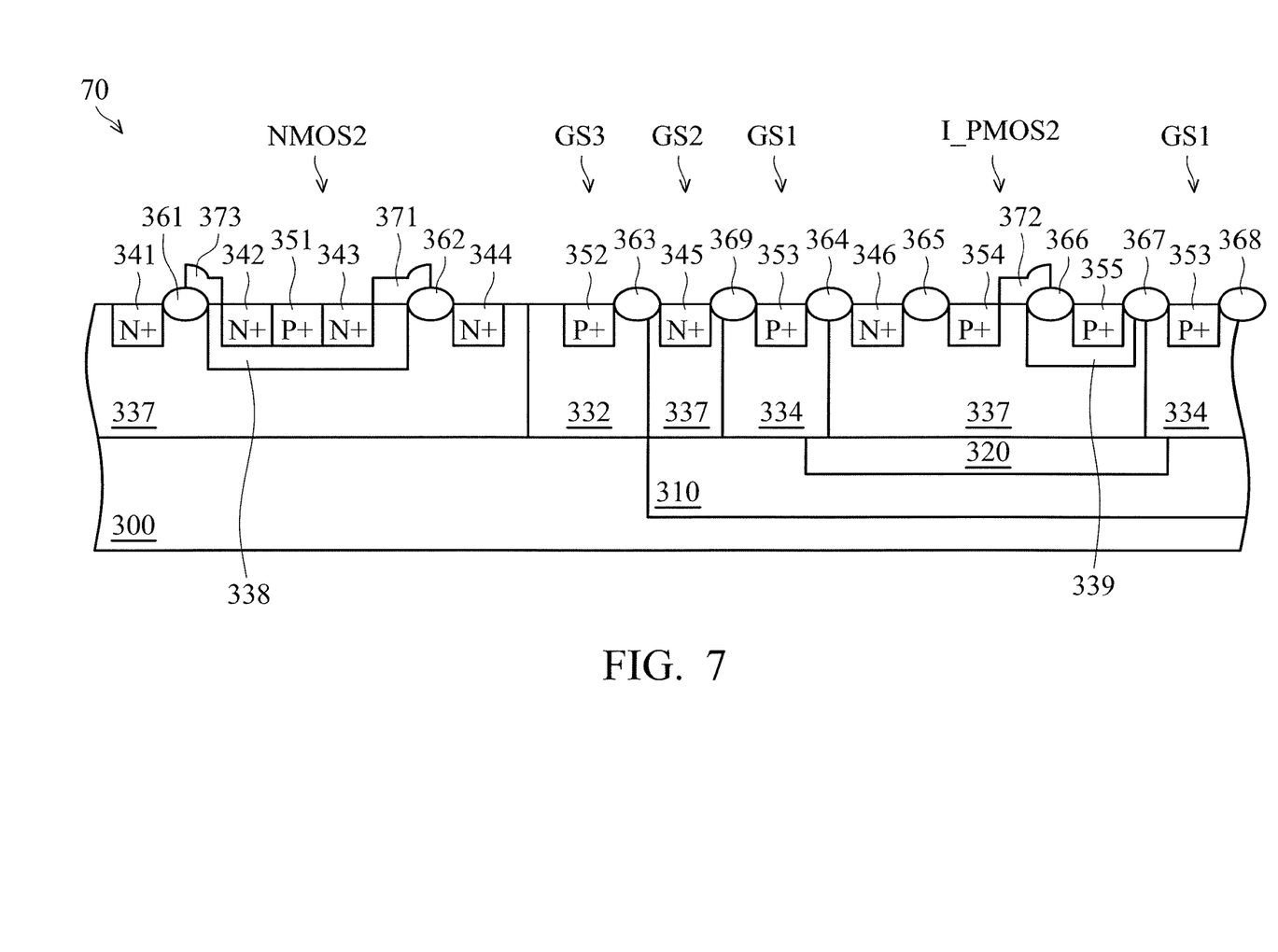
FIG. 7 is a schematic diagram illustrating an embodiment of a semiconductor device of the invention.

FIG. 7 is a schematic diagram illustrating an embodiment of a semiconductor device 70 of the invention. The semiconductor device 70 includes a substrate 300, a NMOS device NMOS2, an isolated PMOS device I_PMOS2 and guard ring devices GS1, GS2 and GS3. The difference between the semiconductor device 70 of FIG. 7 and the semiconductor device 50 of FIG. 5 is that the semiconductor device 70 does not have the high voltage N-type well regions 331, 333 and 335. In the process, the N-type doped region 310 is first formed on the P-type substrate 300, the P-type buried layer 320 is formed on the N-type doped region 310, followed by the N-type epitaxial layer 337 is formed on the P-type buried layer 320, and then the high voltage P-type well regions 332 and 334 are formed on the N-type epitaxial layer 337, wherein the depths of the high voltage P-type well regions 332 and 334 are equal to the thickness of the N-type epitaxial layer 337 such that the high voltage P-type well region 332 contacts substrate 300 and the high-voltage P-type well region 334 contacts the N-type doped region 310 and the P-type buried layer 320. Each region of the N-type epitaxial layer 337 divided by the high voltage P-type well regions 332 and 334 can have similar effects as the high voltage N-type well regions 331, 333 and 335 shown in FIG. 5. The remaining part of the semiconductor device 70 are similar to those of the semiconductor device 50, and thus detailed are omitted here.

In another variation embodiment of the embodiment of FIG. 5, the epitaxial layer 300 may be omitted and the high voltage N-type well regions 331, 333 and 335 and the high voltage P-type well regions 332 and 334 can be directly formed on the substrate 300.

In the above embodiments, each isolation structure can be a field oxide layer (FOX) structure or a shallow trench isolation (STI) structure. It should be noted that, although different reference numerals are utilized to represent each isolation structure, but it is understood that each isolation structure is not limited to be a separated structure while it can be part of a connected isolation structure. For example, a ring isolation structure may include the isolation structure 364 and the isolation structure 367, wherein the ring isolation structure is disposed in the epitaxial layer 330 that is disposed between the junction of the high voltage N-type well region 335 and the high voltage P-type well region 334 and covers part of the high voltage N-type well region 335 and part of the high voltage P-type well region 334.

In the above embodiments, as shown in FIG. 3 to FIG. 7, the N-type doped region 310 is disposed in the P-type substrate 300 under the contact surface, which contacts the high-voltage N-type well region 335 or the N-type epitaxial layer 337, of the P-type buried layer 320, and the upper surface of the P-type buried layer 320 is cut with the upper surface of the P-type substrate 300 and the upper surface of the N-type doped region 310, but the invention is not limited thereto. For example, in one embodiment, the P-type buried layer 320 may diffuse upward so that a part of the P-type buried layer 320 protrudes beyond the surface of the P-type substrate 300 and the surface of the N-type doped region 310. In other words, one part of the P-type buried layer 320 is disposed in the N-type doped region 310 and other parts of the P-type buried layer 320 are not be disposed in the N-type doped region 310.

As described above, one embodiment of the invention is based on the configuration of the P-type buried layer and the N-type doped region under the PMOS device to form the isolated HVPMOS device. As adding the above-described process into the NMOS device side may cause the parameter of the NMOS device change, such as a threshold voltage $V_t$, the saturation current $I_{dSAT}$, the drain-source breakdown voltage BVDss and on-resistance Ron, etc., embodiments of the present invention adding the above-described process into the PMOS device side can prevent, compared to adding the above-described process into the NMOS device side, the time and cost for processing parameters adjustment from being increased and the electrostatic discharge ability from being decreased. In addition, as shown in FIG. 5, for the lateral path PA1, the lateral SCR path can be eliminated by the configuration of the guard rings GS1, GS2 and GS3 SCR, and for the vertical path PA2, the vertical SCR path can be eliminated by adding the P-type buried layer 320 and the N-type doped region 310 under the PMOS device, thus eliminating the SCR path on both the lateral path and the vertical path to reach the semiconductor devices that avoid the latch-up.

The above description is presented to enable a person of ordinary skill in the art to practice the present invention as provided in the context of a particular application and its requirements. Those with skill in the art can easily adjust it on the basis of design or purpose to implement the same and/or to achieve the same advantages of the embodiments described herein. Various modifications to the described embodiments will be apparent to those with skill in the art, and the general principles defined herein may be applied to other embodiments. Therefore, the scope of the appended claims should be accorded to the broadest interpretation so as to encompass all such modifications and similar arrangements. The method represents only illustrative and exemplary steps, and these steps are not necessarily performed in the order indicated. Those with skill in the art can add, replace, change the order of and/or eliminate steps to make adjustments as appropriate and consistent with the spirit and scope of the disclosed embodiments.

What is claimed is:

1. A semiconductor device, comprising:
   a P-type substrate;
   an N-type region, contacting the P-type substrate;
   an N+ doped region, disposed in the N-type region;
   a first P+-type doped region, disposed in the N-type region;
   a second P+-type doped region, disposed in the N-type region;
   a P-type buried layer, disposed in the P-type substrate under the N-type region and contacting the N-type region; and
   an N-type doped region, disposed in the P-type substrate under a contact surface between the P-type buried layer and the N-type region.

2. The semiconductor device as claimed in claim 1, wherein a portion of the P-type buried layer is disposed in the N-type doped region, other parts of the P-type buried layer is not disposed in the N-type doped region.

3. The semiconductor device as claimed in claim 1, wherein the N-type doped region is a N-type buried layer or a deep N-well region.

4. The semiconductor device as claimed in claim 1, further comprising:
   an epitaxial layer formed on the P-type buried layer;
   wherein the N-type region is a high-voltage N-type well region and is disposed in the epitaxial layer.

5. The semiconductor device as claimed in claim 1, wherein the N-type region comprises:
   an N-type epitaxial layer formed on the P-type buried layer; and
   a high voltage N-type well region, disposed in the N-type epitaxial layer, wherein the high voltage N-type well region does not contact the P-type buried layer.

6. The semiconductor device as claimed in claim 1, wherein the N-type region is an N-type epitaxial layer or a high voltage N-type well region.

7. The semiconductor device as claimed in claim 1, further comprising a gate structure disposed in the N-type region disposed between the first P+-type doped region and the second P+-type doped region.

8. The semiconductor device as claimed in claim 1, further comprising:
   a first isolation structure, disposed in the surface of the N-type region between the N+-type doped region and the first P+-type doped region.

9. The semiconductor device as claimed in claim 1, further comprising:
   a P-type heavily doped drain region disposed in the first N-type region, wherein the second P+-type doped region is disposed in the P-type heavily doped drain region; and
   a second isolation structure, disposed in the surface of the P-type heavily doped drain and adjacent to the second P+-type doped region, wherein part of the second isolation structure is covered by the first gate structure.

10. A semiconductor device, comprising:
    a P-type substrate;
    an N-type metal oxide semiconductor (NMOS) device; and
    a P-type metal oxide semiconductor (PMOS) device, comprising:
    a first N-type region contacting the P-type substrate;
    a first N+-type doped region disposed in the first N-type region;
    a first P+-type doped region disposed in the first N-type region;
    a second P+-type doped region disposed in the first N-type region;
    a first gate structure, disposed in the N-type doped region between the first P+-type doped region of and the second P+-type doped region;
    a P-type buried layer disposed in the P-type substrate under the first N-type region and contacting the first N-type region; and
    an N-type doped region, disposed in the P-type substrate under a contact surface between the P-type buried layer and the first N-type region.

11. The semiconductor device as claimed in claim 10, wherein the N-type doped region is a N-type buried layer or a deep N-type well region.

12. The semiconductor device as claimed in claim 11, wherein the area of the side, which contacts the N-type doped region, of the P-type buried layer is larger than that of the side, which contacts the first N-type region, of the P-type buried layer.

13. The semiconductor device as claimed in claim 10, wherein the PMOS device further comprises:
    a first isolation structure, disposed in the surface of the first N-type region between the first N+-type doped region and the first P+-type doped region.

14. The semiconductor device as claimed in claim 10, wherein the PMOS device further includes:
    a P-type heavily doped drain region disposed in the first N-type region, wherein the second P+-type doped region is disposed in the P-type heavily doped drain region; and
    a second isolation structure, disposed in the surface of the P-type heavily doped drain and adjacent to the second P+-type doped region, wherein part of the second isolation structure is covered by the first gate structure.

15. The semiconductor device as claimed in claim 10, wherein the NMOS device is a laterally diffused N-type metal oxide semiconductor (LDNMOS) device.

16. The semiconductor device as claimed in claim 10, wherein the NMOS device further comprises:
    a second N-type region contacting the P-type substrate;
    a P-type bulk region, disposed in the second N-type region;
    a third P+-type doped region, disposed in the P-type bulk region;
    a second N+-type doped region, disposed in the P-type bulk region and adjacent to one side of the third P+-type doped region;
    a third N+-type doped region, disposed in the P-bulk region and adjacent to the other side of the third P+-type doped region;
    a fourth N+-type doped region, disposed in the second N-type region;
    a fifth N+-type doped region, disposed in the second N-type region; and
    a second gate structure, disposed in the second N-type region between the third N+-type doped region and the fourth N+-type doped region and covering part of the P-type bulk region.

17. The semiconductor device as claimed in claim 16, wherein the NMOS device further comprises:
    a third isolation structure, disposed in the surface of the second N-type region between the P-type bulk region and the fifth N+-type doped region; and
    a fourth isolation structure, disposed in the surface of the second N-type region between the P-type bulk region and the fourth N+-type doped region, wherein part of the fourth isolation structure is covered by the second gate structure.

18. The semiconductor device as claimed in claim 10, further comprising:
  a first guard ring device, contacting the P-type substrate and surrounding the first N-type region;
  a second guard ring device, contacting the P-type substrate and surrounding the first guard ring device; and
  a third guard ring device, contacting the P-type substrate and surrounding the NMOS device.

19. The semiconductor device as claimed in claim 18, wherein the P-type buried layer contacts a first high voltage P-type well region.

20. The semiconductor device as claimed in claim 18, wherein the N-type doped region contacts the third N-type region.

\* \* \* \* \*